United States Patent
Mankowski

(10) Patent No.: US 9,543,861 B2
(45) Date of Patent: Jan. 10, 2017

(54) PIEZOELECTRIC GENERATOR

(71) Applicant: Research In Motion Limited, Waterloo (CA)

(72) Inventor: Peter Mankowski, Waterloo (CA)

(73) Assignee: BlackBerry Limited, Waterloo (CA)

( * ) Notice: Subject to any disclaimer, the term of this patent is extended or adjusted under 35 U.S.C. 154(b) by 208 days.

(21) Appl. No.: 13/757,897

(22) Filed: Feb. 4, 2013

(65) Prior Publication Data

US 2014/0217853 A1    Aug. 7, 2014

(51) Int. Cl.
*H01L 41/047* (2006.01)
*H02N 2/18* (2006.01)
*H01L 41/18* (2006.01)
*H01L 41/187* (2006.01)

(52) U.S. Cl.
CPC ............ *H02N 2/18* (2013.01); *H01L 41/0475* (2013.01); *H01L 41/18* (2013.01); *H01L 41/187* (2013.01); *H01L 41/1871* (2013.01); *H01L 41/1876* (2013.01)

(58) Field of Classification Search
CPC .................................. H02N 2/18; F23Q 3/002
USPC .................................................. 310/339, 319
See application file for complete search history.

(56) References Cited

U.S. PATENT DOCUMENTS

| | | | |
|---|---|---|---|
| 4,849,946 A * | 7/1989 | Beauducel | G01L 9/08 310/331 |
| 6,777,856 B2 | 8/2004 | Brechbuhl et al. | |
| 6,894,460 B2 | 5/2005 | Clingman | |
| 7,351,607 B2 | 4/2008 | Wang et al. | |
| 7,456,708 B2 * | 11/2008 | Chou | H01L 41/107 310/357 |
| 7,898,156 B2 | 3/2011 | Wang et al. | |
| 2009/0021117 A1* | 1/2009 | Ueda | G01H 11/08 310/329 |
| 2009/0229142 A1* | 9/2009 | Rastegar et al. | 36/2.6 |
| 2010/0237747 A1* | 9/2010 | Axelrod | B82Y 30/00 310/339 |
| 2010/0277126 A1* | 11/2010 | Naeimi | H02K 7/1853 320/137 |
| 2011/0140579 A1* | 6/2011 | Moon et al. | 310/339 |
| 2011/0224330 A1 | 9/2011 | Sodano et al. | |
| 2013/0034724 A1 | 2/2013 | Sodano | |

FOREIGN PATENT DOCUMENTS

EP         1605528 A2    12/2005
WO    WO 2006/121818 A2    11/2006

OTHER PUBLICATIONS

Extended European Search Report; EP 13153889.4; Jun. 21, 20130.

(Continued)

*Primary Examiner* — Derek Rosenau
*Assistant Examiner* — Bryan Gordon
(74) *Attorney, Agent, or Firm* — Ridout and Maybee LLP

(57) ABSTRACT

The present disclosure provides an ionic ring comprising a number of piezoelectric elements, a piezoelectric device including the ionic ring, and a piezoelectric generator including the ionic ring and host devices incorporating the piezoelectric generator. The piezoelectric generator can be used to generate energy on a portable electronic device in response to mechanical deformation. The generated energy can be used instead of a battery of the portable electronic device or can be used to charge the battery.

27 Claims, 7 Drawing Sheets

(56) References Cited

OTHER PUBLICATIONS

Helmut Föll, Electronic Materials: 3.6.1: Piezo Electricity and Related Effects http://www.tf.unikiel.de/matwis/amat/elmat_en/kap_3/backbone/r3_6_1.html, Faculty of Engineering, University of Kiel, at least as early as Jun. 13, 2011.

Unknown Author, New Piezoceramic Linear Actuators and Amplifiers from PI Cater for High Force Applications, http://www.azonano.com/news.aspx?newsID=5687, Jan. 18, 2008.

Unknown Author, Introduction to Piezo Transducers, Piezo Systems, Inc., http://www.piezo.com/tech2intropiezotrans.html, at least as early as Jun. 18, 2012.

Unknown Author, Energy harvesting, Wikipedia, http://en.wikipedia.org/wiki/Energy_harvesting#Piezoelectric_energy_harvesting, at least as early as Jun. 18, 2012.

Cheng-Ying Chen, Te-Hsiang Liu, Yusheng Zhou, Yan Zhang, Yu-Lun Chueh, Ying-Hao Chu, Jr-Hau He and Zhong Lin Wang, Electricity generation based on vertically aligned PbZr0.2Ti0.8O3 nanowire arrays, Rapid Communication, 2012.

Sheng Xu, Benjamin J. Hansen & Zhong Lin Wang, Piezoelectric-nanowire-enabled power source for driving wireless microelectronics, Nature Communications, 1:93, DOI: 10.1038, ncomms1098, www.nature.com/naturecommunications, Oct. 19, 2010.

Ottman, G.K., Hofmann, H.F. and Lesieutre, G.A., Optimized piezoelectric energy harvesting circuit using step-down converter in discontinuous conduction mode, IEEE Transactions on Power Electronics, vol. 18, Issue 2, Mar. 2003, p. 696-703.

Mickael Lallart and Daniel Guyomar, Nonlinear energy harvesting, 2011 IOP Conf. Ser.: Mater. Sci. Eng. Sep. 18, 2006.

Zhong Lin Wang, Rusen Yang, Jun Zhou, Yong Qin, Chen Xu, Youfan Hu and Sheng Xu, Lateral nanowire/nanobelt based nanogenerators, piezotronics and piezo-phototronics, Materials Science and Engineering: Reports, vol. 70, Issues 3-6, Nov. 22, 2010, pp. 320-329.

Emma Roller, The Body Electric: How much energy can you extract from a dance?, Slate, Mar. 13, 2013, http://www.slate.com/articles/health_and_science/alternative_energy/2013/03/kinetic_energy_harvesting_technology_to_power_lights_cell_phones_medical.html.

Office Action; EP Application No. 13153889.4; Oct. 8, 2015.

* cited by examiner

PIEZOELECTRIC GENERATOR

TECHNICAL FIELD

The present application relates to a piezoelectric generator, and in particular, to a piezoelectric generator and related devices.

BACKGROUND

Batteries and other power packs or portable energy sources are important considerations in the design of portable electronic devices. The challenge of supplying the necessary power to portable electronic devices is ever demanding as energy consumption is increasing with more energy intensive hardware, such as touchscreens and multicore central processors, at the same time that devices are getting smaller and lighter, putting pressure on batteries of all types and designs to be similarly smaller and lighter. The use of smaller and lighter batteries often results in reduce energy density, causing reduced battery life between charges, resulting in the need for more frequent charging. Thus, there remains a need for improved solutions for powering portable electronic devices.

DETAILED DESCRIPTION OF EXAMPLE EMBODIMENTS

Figure 1B:
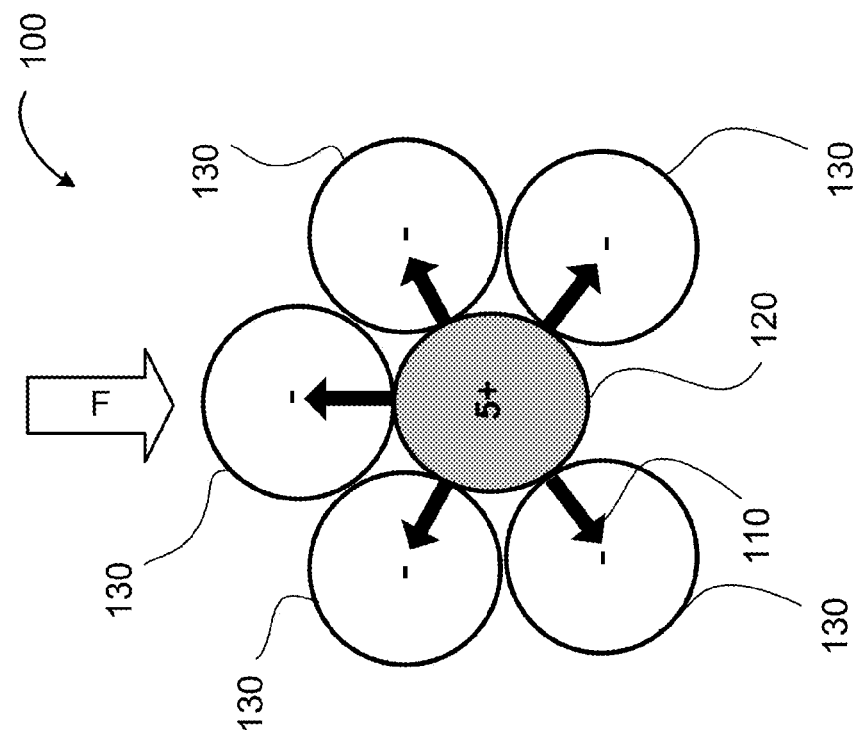
FIG. 1B is a schematic diagram of the five dipole piezoelectric crystal of FIG. 1A showing cationic and anionic components in which the piezoelectric crystal is in an actuated state.

The present disclosure provides an ionic ring comprising a number of piezoelectric elements for use in a piezoelectric generator, a piezoelectric generator including an ionic ring, and related devices including the piezoelectric generator. The piezoelectric generator can be used to generate electrical energy on a portable electronic device in response to (elastic) mechanical deformation. In other words, a piezoelectric generator converts mechanical energy (such as applied force or stress) to electrical energy that can be used by the portable electronic device. The piezoelectric generator provides an alternative to a battery as a source of power on the portable electronic device. The piezoelectric generator could be used to charge a battery or other power pack of the portable electronic device, or may supply power for consumption by electronic components of the portable electronic device, or both.

In accordance with one aspect of the present disclosure, there is provided an piezoelectric device, comprising: a piezoelectric element having a number of dipoles, wherein the dipoles are arranged such that, in an unactuated state of the piezoelectric element, a zero dipole moment is formed by the dipoles of the piezoelectric element and, in an actuated state of the piezoelectric element caused by a force, a net dipole moment is formed by the dipoles of the piezoelectric element. The piezoelectric device may further comprise a pair of electrodes located about the piezoelectric element to conduct (or receive) a current created by the net dipole moment formed by the dipoles of the piezoelectric element.

In accordance with another aspect of the present disclosure, there is provided a piezoelectric generator, comprising: a piezoelectric device, comprising: a piezoelectric element having a number of dipoles, wherein the dipoles are arranged such that, in an unactuated state of the piezoelectric element, a zero net dipole moment is formed by the dipoles of the piezoelectric element and, in an actuated state of the piezoelectric element caused by a force, a net dipole moment is formed by the dipoles of the piezoelectric element; and a pair of electrodes located about the piezoelectric element to conduct (or receive) a current created by the net dipole moment formed by the dipoles of the piezoelectric element; and an energy harvesting circuit connected to the piezoelectric device to capture and store electrical energy provided by the current.

The piezoelectric device may be embedded in a housing of a portable electronic device. The piezoelectric elements may be arranged in an array or lattice formation throughout the case. The piezoelectric device may be embedded at or proximate to a key, a touchscreen, a buzzer or a speaker of the portable electronic device.

The piezoelectric device may be a piezoelectric cable comprised of a plurality of ionic rings arranged in a stacked formation, wherein each ionic ring comprises a number of piezoelectric elements received within a dielectric substrate with the piezoelectric elements arranged in an annular formation in the dielectric substrate with the piezoelectric elements equally spaced apart from each other. The piezoelectric cable is embedded in an article which can be carried or worn. The piezoelectric cable is embedded in a data and/or power cable or cord.

In accordance with a further aspect of the present disclosure, there is provided an ionic ring, comprising: a number of piezoelectric elements received within a dielectric substrate, wherein the piezoelectric elements are arranged in a ring-shape in a dielectric substrate and are equally spaced apart from each other in the ring-shaped arrangement, each piezoelectric element having a number of dipoles, wherein the dipoles are arranged such that, in an unactuated state of the piezoelectric element, a zero dipole moment is formed by the dipoles of the piezoelectric element and, in an actuated state of the piezoelectric element caused by a force, a net dipole moment is formed by the dipoles of the piezoelectric element. The ionic ring may further comprise a pair of electrodes located about the piezoelectric element to conduct (or receive) a current created by the net dipole moment formed by the dipoles of the piezoelectric element Reference will now be made to the accompanying drawings which show, by way of example, example embodiments of the present disclosure. For simplicity and clarity of illustration, reference numerals may be repeated among the Figures to indicate corresponding or analogous elements. Numerous details are set forth to provide an understanding of the example embodiments described herein. The example embodiments may be practiced without these details. In other instances, well-known methods, procedures, and components have not been described in detail to avoid obscuring the example embodiments described. The description is not to be considered as limited to the scope of the example embodiments described herein.

Figure 1A:
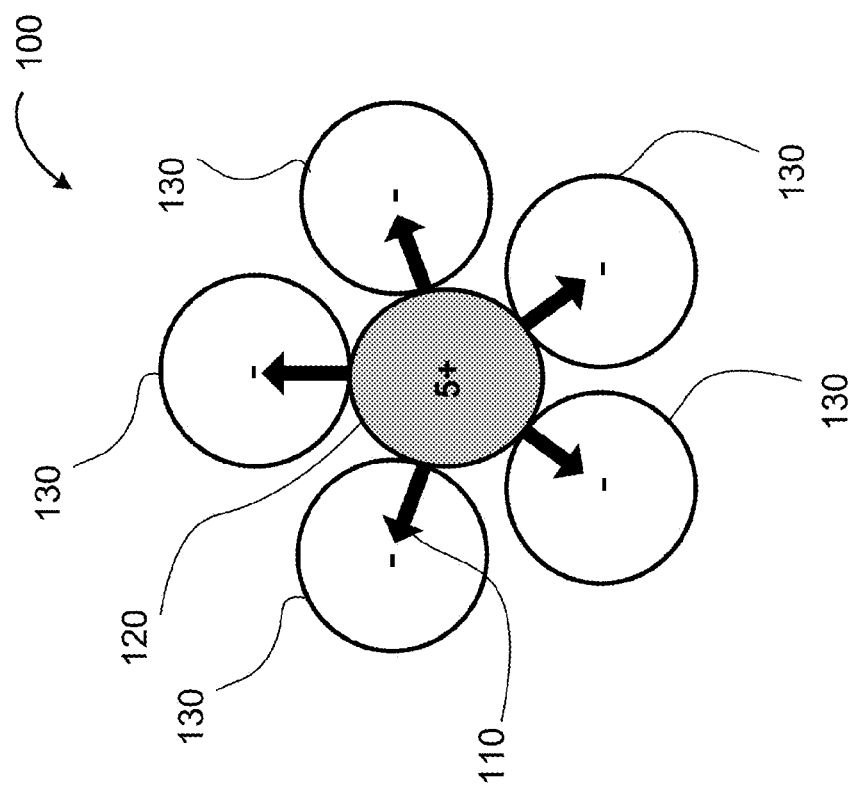
FIG. 1A is a schematic diagram of a five dipole piezoelectric crystal showing cationic and anionic components in which the piezoelectric crystal is in an unactuated state.

FIGS. 1A and 1B show a piezoelectric element 100 in schematic form in accordance with an example embodiment of the present disclosure. Piezoelectric materials include but are not limited to crystals and ceramics. Examples of piezoelectric crystals include quartz ($SiO_2$), berlinite ($AlPO_4$), gallium orthophosphate ($GaPO_4$), tourmaline, topaz, Rochelle salt, cane sugar. Examples of piezoelectric ceramics include barium titanate ($BaTiO_3$) and lead zirconate titanate ($PbZr_xTi_{1-x}O_3$) or "PZT". Piezoelectric materials generate an electrical potential difference (i.e., voltage), when a force such as a mechanical stress, such as (elastic) mechanical deformation, is applied to the piezoelectric material. The voltage generated by the piezoelectric material depends on the molecular structure of the piezoelectric material and the force applied. The voltage can be used to create an electrical current or flow of charge (voltage and current are related to electrical energy and electrical power) when properly connected to a circuit, such as an energy harvesting circuit.

The piezoelectric element 100 is a piezoelectric crystal, in particular, a polycrystal which comprises a number (in this context, a number may be an integer of two or more) of ionic components in the form of positive (cationic) components 120 and negative (anionic) components 130. A dipole 110 having a dipole moment is created between a cationic component 120 and an anionic component 130. A dipole moment is a measure of the separation of positive and negative electrical charges in the piezoelectric element 100 (a measure of the overall polarity of the piezoelectric element 100). In FIGS. 1A and 1B, each dipole 110 is represented as an arrow between a cationic component in the centre of the polycrystal and an anionic component which surrounds the cationic component in the centre. In other embodiments, the polarity of the ionic components could be reversed. Unlike a monocrystal in which each dipole is oriented in the same direction, the dipoles of a polycrystal are each oriented in a different direction. As appreciated by persons skilled in the art, the direction of orientation of a dipole 110 is referred to as its poling axis.

FIG. 1A shows the piezoelectric element 100 at rest with no force applied. FIG. 1B shows the piezoelectric element 100 undergoing elastic deformation caused by a force such as, for example, a compressive force "F". In the unactuated state (rest state) of FIG. 1A, the polarization of the dipoles 110 is such that the individual dipoles 110 cancel each other resulting in a dipole moment (or a net dipole moment) of zero (which may include dipole moments that are negligible as well as dipole moments which are precisely zero). The balanced condition of the piezoelectric element 100 in the unactuated state may be naturally occurring or created by applying heat and one or more strong electrical fields to the polycrystal. The heat allows the molecules of the polycrystal to move more freely and the one or more electrical fields cause the dipoles 110 in the polycrystal to lineup to align in the direction of a respective electric field. In other examples, it is contemplated that the piezoelectric element 100 may have a positive or negative net dipole moment in the unactuated state.

When a force (e.g., mechanical stress) is applied to the piezoelectric element 100, displacement of the dipoles 110 occurs and the piezoelectric element 100 changes from the unactuated state to the actuated state. Displacement of the dipoles 110 is caused by non-symmetrically shifting of the cations and anions in the molecular structure (e.g., crystal structure) of the piezoelectric element 100, breaking the balance condition of the dipoles 110 and resulting in a net dipole moment. In the actuated state in the shown example shown in FIG. 1B, the space between the dipoles 110 in the upper portion of the piezoelectric element 100 compresses in response to the compressive force "F" while the space between the dipoles 110 in the lower portion of the piezoelectric element 100 expands in response to the compressive force "F". The displacement of the dipoles 110 causes a change in the dipole moment of the piezoelectric element 100 from zero to a net dipole moment, which may be positive or negative depending on the type and direction of the force which is applied. The principle underlying this response is known as inducement of polarization by mechanical deformation. The direction of the net dipole moment depends on the geometric configuration of the piezoelectric element 100 and the location and magnitude of the force.

While the applied force has been described as a compressive force in the example of FIGS. 1A and B for the purpose of explanation, the force applied to the piezoelectric element 100 can be a compression force, expansion or stretching force, vibration, torque or any other force or type of mechanical energy which causes a displacement of the dipoles 110 from the unactuated state. The force may be oriented in any direction in two or three dimensional space.

As noted above, the piezoelectric element 100 has a zero dipole moment in the unactuated state and a net dipole moment in the actuated state. This configuration is achieved in some embodiments by orienting the dipoles 110 in the piezoelectric element 100 to be asymmetrically arranged in the unactuated state such that the dipoles 110 lack a center of symmetry (i.e., no center of symmetry and no inversion symmetry). The dipoles 110 have a center of symmetry when, for any dipole 110 in the piezoelectric element 100, a dipole exists diametrically opposite the center of the piezoelectric element 100 at an equal distance from it. The asymmetry of the dipoles 110 may be provided by using an odd number of dipoles. Without intending to be bound by theory, it is believed that an odd number of dipoles 110 will avoid or reduce the likelihood that an applied force causes a displacement in which the individual dipoles 110 cancel each other resulting in a dipole moment of zero. It is also believed that, in some examples, a piezoelectric element 100 having an odd number of dipoles 110 may have a larger net dipole in response to mechanical deformation, and that the larger net dipole may be achieved irrespective of the direction from which a force is applied to the piezoelectric element. The piezoelectric element 100, when provided with an odd number of dipoles, may have 3, 5 or 7 dipoles, or possibly more. In a preferred embodiment, the piezoelectric element 100 has 5 dipoles.

Figure 1C:
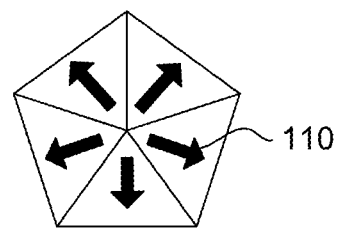
FIG. 1C is schematic diagram of a five dipole piezoelectric crystal showing an example geometric configuration of the piezoelectric crystal.

FIG. 1C illustrates an example of a five dipole piezoelectric crystal which can be used to apply the teachings of the present disclosure. The five dipole piezoelectric crystal is generally a pentagonal with the dipoles oriented in different directions with each dipole oriented from the centre of the piezoelectric crystal to a respective side or face of the piezoelectric crystal. A five dipole piezoelectric crystal having a different geometric configuration and/or with a different dipole orientation could be used.

Figure 1D:
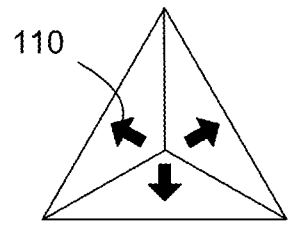
FIG. 1D is schematic diagram of a three dipole piezoelectric crystal showing an example geometric configuration of the piezoelectric crystal.

FIG. 1D illustrates an example of a three dipole piezoelectric crystal which can be used to apply the teachings of the present disclosure. The three dipole piezoelectric crystal is generally a triangular with the dipoles oriented in different directions with each dipole oriented from the centre of the piezoelectric crystal to a respective side or face of the piezoelectric crystal. A three dipole piezoelectric crystal having a different geometric configuration and/or with a different dipole orientation could be used.

While the shown embodiment in FIGS. 1A and 1B has five dipoles, it will be appreciated that the piezoelectric element 100 may have a different number of dipoles 110 in other example embodiments. The number of dipoles may depend on the material and structure of the piezoelectric element 100. Increasing the number of dipoles 110 increases the dipole density. A piezoelectric element 100 having more dipoles 110 may result in a larger net dipole moment in response to mechanical deformation. The amount of piezoelectricity which is generated depends on the orientation of dipole and dipole density within the piezoelectric element, crystal/material symmetry, and applied mechanical stress. Accordingly, the number of dipoles alone does not determine which piezoelectric element will generate more electricity.

While examples of the piezoelectric element 100 have been shown and described for the purpose of illustration, the arrangement of the dipoles is dependent on a number of factors including, but not limited to the piezoelectric material of the piezoelectric element, structure of the piezoelectric element and/or the process of manufacturing the piezoelectric element.

While the piezoelectric element 100 is illustrated in two dimensions in FIGS. 1A and 1B, in other embodiments the piezoelectric element 100 and the dipoles 110 may occupy three dimensions and may be arranged in a three dimensional space.

While the use of piezoelectric crystals in the piezoelectric elements 100 is described herein for purpose of example, other piezoelectric materials could be used. The type of piezoelectric material used in a given embodiment can be selected for piezoelectric properties, hardness/softness, resilience, or for any other property or combination of properties. In some examples, a material may be doped to attain a desired property such as the hardness/softness of the material.

Figure 2:
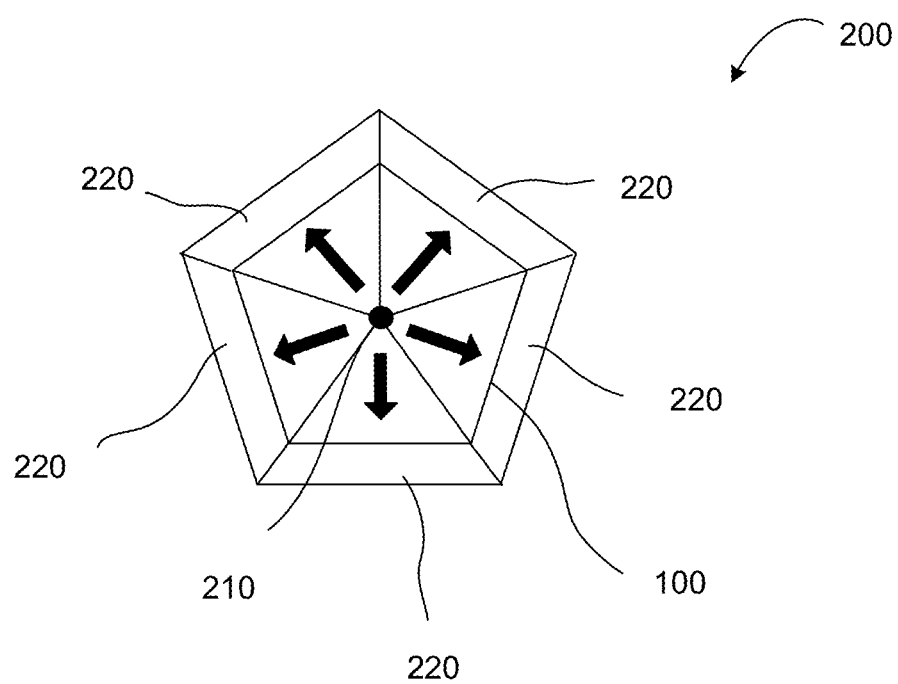
FIG. 2 is a schematic diagram of a piezoelectric device in accordance with an example embodiment of the present disclosure.

Referring now to FIG. 2, an example piezoelectric device 200 in accordance with the present disclosure will now be described. The piezoelectric device 200 comprises a piezoelectric element having a number of dipoles, such as the piezoelectric element 100 described above. As described above, the dipoles are arranged such that, in an unactuated state of the piezoelectric element 100, a zero dipole moment is formed by the dipoles of the piezoelectric element 100 and, in an actuated state of the piezoelectric element 100 caused by a force, a net dipole moment is formed by the dipoles of the piezoelectric element 100. In the shown example, the piezoelectric element 100 is the five dipole piezoelectric crystal of FIG. 1C. A five dipole piezoelectric crystal having a different geometric configuration could be used in other embodiments, or a piezoelectric crystal or other piezoelectric element having a different number of dipoles could be used in other embodiments.

The piezoelectric device 200 also comprises a pair of electrodes located about the piezoelectric element 100 to conduct (or receive) a current created by the net dipole moment formed by the dipoles of the piezoelectric element 100. In general, the electrodes may be located about a piezoelectric element 100 when the electrodes are in a position to conduct current that may be generated by or that may pass through the piezoelectric element 100. In a typical embodiment, the piezoelectric element 100 may enter an actuated state in response to application of force from one or more directions, creating a positive or negative net dipole moment and thereby generating an electrical voltage and current. In the shown example, the pair of electrodes is provided by a first electrode 210 which is connected to the cationic components 120 of the piezoelectric element 100 (e.g., a positive electrode) and a second electrode 220 which is connected to the anionic components 130 of the piezoelectric element 100 (e.g., a negative electrode). The electrodes are connected to the cationic components 120 and anionic components 130 of the piezoelectric element 100 via laser soldering, bonding, deposition, etching, or any other suitable technique. Examples of suitable bonding materials to bond the electrodes to the cationic components 120 and anionic components 130 of the piezoelectric element 100 include cyanoacrylate and two part epoxies.

If a piezoelectric element 100 is compressed, a voltage of the same polarity as the poling voltage will appear between the electrodes 210, 220. If a piezoelectric element 100 is stretched, a voltage of opposite polarity as the poling voltage will appear between the electrodes 210, 220.

FIG. 2 illustrates an embodiment in which the first electrode 210 is located in or near the center of the piezoelectric element 100. The first electrode 210 could be rod shaped or other shape such as cylinder or cone. The second electrode 220 surrounds the outside of the piezoelectric element. The second electrode 220 is pentagonally shaped to correspond to the shape of the piezoelectric element 100 in the shown embodiment. The second electrode 220 may be comprised of five plates configured in a pentagonal shape which are electrically connected or couple. Alternatively, the second electrode 220 could be implemented as individual electrodes for each dipole (e.g., five electrodes in the shown embodiment). In such an alternative, the first electrode 210 could similar be implemented as individual electrodes for each dipole (e.g., five electrodes in the shown embodiment). If a piezoelectric element having different geometric configuration is used, the configuration of the second electrode 220 should be changed to correspond to the shape of the piezoelectric element 100.

Figure 3A:
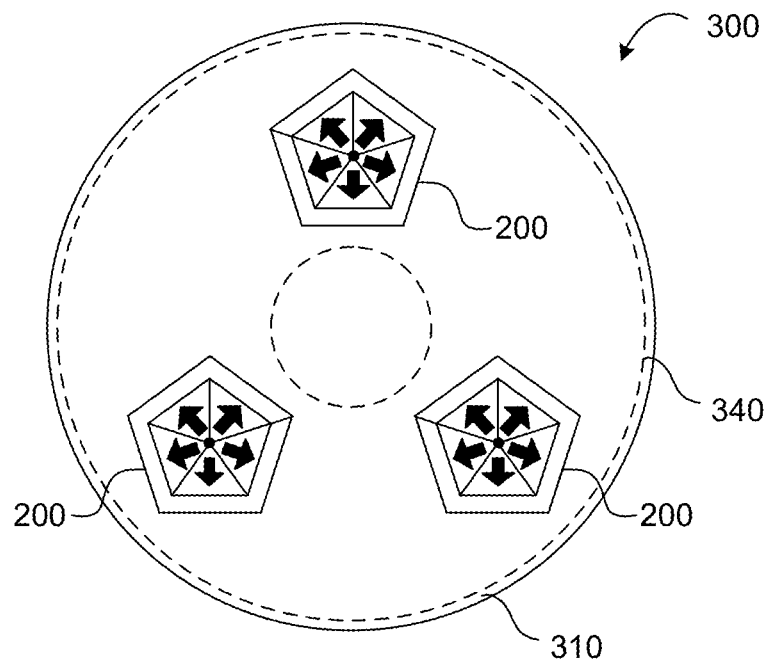
FIG. 3A is a schematic diagram of a piezoelectric device incorporating the piezoelectric device of FIG. 2 in accordance with one example embodiment of the present disclosure.

FIG. 3A illustrates a piezoelectric device 300 incorporating the piezoelectric device 200 of FIG. 2 in accordance with one example embodiment of the present disclosure. The piezoelectric device 300 comprises a number of piezoelectric elements 100 received (e.g., embedded) within a dielectric substrate 310. The dielectric substrate 310 is a suitable non-conductive (i.e., electrically insulating) material which illustrates the current generated by the piezoelectric devices 200, described below. The dielectric substrate 310 is also selected to elastically deform in response to applied forces. The piezoelectric elements 100 are each part of a piezoelectric device 200 in the shown embodiment. Different piezoelectric elements having a different number of dipoles or a different geometric or structural configuration may be used in other embodiments.

The piezoelectric elements 100 are arranged annularly in a ring-like shape in the dielectric substrate 310 to form an ionic ring (or piezoelectric ring) 340 comprising a number of piezoelectric elements. When the piezoelectric elements are piezoelectric crystals, the ionic ring 340 provides a circular array of piezoelectric crystals. It should be appreciated that the ionic ring 340 is functional area of the piezoelectric device 300 which is defined by the piezoelectric elements 100 rather than a structure. The piezoelectric elements 100 are preferably equally spaced apart from each other to provide a more uniform distribution to more uniformly receive and react to applied forces. In the shown embodiment, the piezoelectric device 300 has a circular disc shape which complements the annular arrangement of the piezoelectric elements 100 and cooperates with the equal spacing between the piezoelectric elements 100 to more uniformly receive and react to applied forces.

In the shown embodiment, piezoelectric device 300 includes three piezoelectric devices 200/piezoelectric elements 100 so the piezoelectric devices 200/elements 100 are spaced 120 degrees apart from each other in the annular formation. A different number of piezoelectric elements can be used in other embodiments; however, typically no fewer than includes three piezoelectric elements 100 are used for efficacy of the piezoelectric device 300. Increasing the number of piezoelectric elements 100 increases the number of dipoles 110 and thereby increases the dipole density. As described above, having more dipoles 110 may result in a larger net dipole moment in response to mechanical deformation, which may in turn increase the energy produced by the piezoelectric device 300 and available for capture or harvest.

The arrangement of the multiple piezoelectric elements 100 in an annulus is believed to avoid or reduce the likelihood that an applied force causes a displacement in which the individual dipoles 110 cancel each other resulting in a dipole moment of zero. This permits electrical potentials to be generated by mechanical deformations in the piezoelectric device 300 irrespective of the location or direction of the force causing the deformation. These forces can include forces in any direction with respect to the piezoelectric device 300 including but not limited to axial forces, radial forces, tangential forces or any combination thereof.

While an example of a piezoelectric device 200 having a piezoelectric element 100 for use in the piezoelectric device 300 has been described, other piezoelectric devices and piezoelectric elements having a different configuration may be used in other embodiments. The piezoelectric device 300, for example, may have piezoelectric devices with different piezoelectric elements. The piezoelectric elements could differ in terms of piezoelectric material, configuration and/or number of dipoles.

Figure 3B:
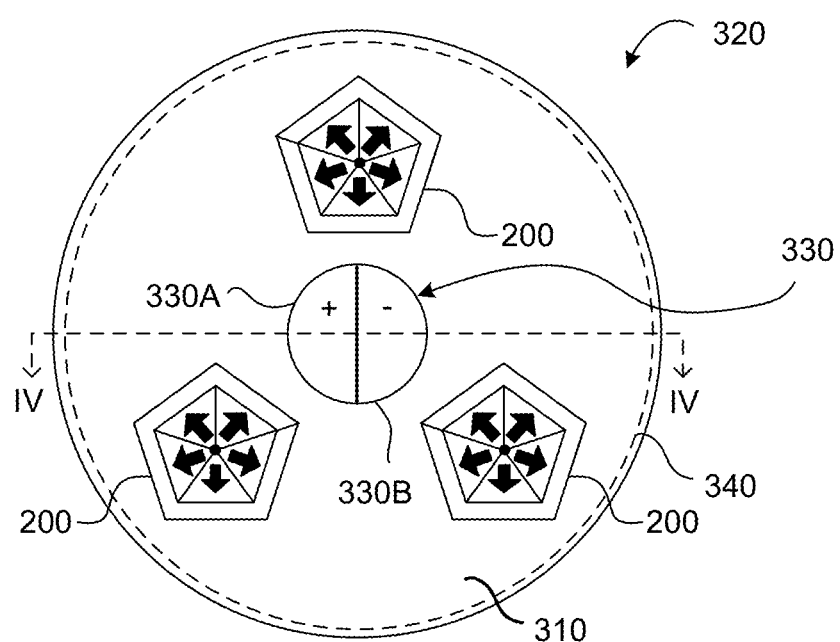
FIG. 3B is a schematic diagram of a piezoelectric device incorporating the piezoelectric device of FIG. 2 in accordance with another example embodiment of the present disclosure.

FIG. 3B is a schematic diagram of a piezoelectric device 320 incorporating the piezoelectric device 200 of FIG. 2 in accordance with another example embodiment of the present disclosure. FIG. 3B shows the piezoelectric device 320 in sectional form. The piezoelectric device 320 is similar to the piezoelectric device 300 but includes a central conductor 330 for connector to the pair of electrodes in each of the piezoelectric devices 200. The conductor 330 includes a first conductor 330A (e.g., positive conductor) for connecting to the first electrode 210 of each piezoelectric device 200, which in turn is connected to the cationic components 120 of each piezoelectric element 100. The conductor 330 also includes a second conductor 330B (e.g., negative conductor) for connecting to the second electrode 220 of each piezoelectric device 200, which in turn is connected to the anionic components 130 of each piezoelectric element 100.

The first conductor 330A and second conductor 330B are connected to the first electrode 210 and second electrode 220, respectively, using an electrical connector (not shown). The electrical connector may be any suitable electrical connector, such as a wire or flexible printed circuit board (PCB), and can be connected in any suitable manner. The electrical connectors may be the first conductor 330A or second conductor 330B, or be part of the first conductor 330A or second conductor 330B (e.g., the electrical connectors may be integrally formed with the first conductor 330A and second conductor 330B, respectively). In such embodiments, the first conductor 330A and second conductor 330B may be wires or leads connecting the first electrode 210 and second electrode 220 to an energy harvesting circuit, described below. If individual electrodes are provided for each dipole in the piezoelectric element 100, individual conductors and connectors should be used for each electrode pair rather than the single conductor 330.

Figure 4:
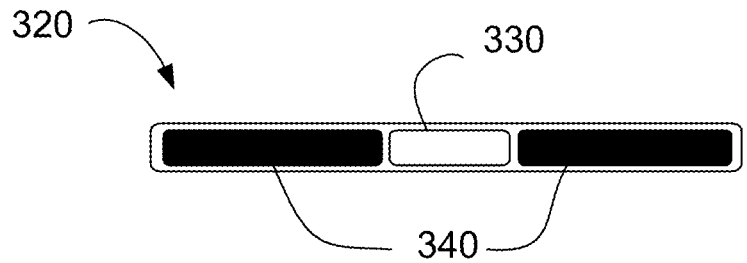
FIG. 4 is a sectional view of the piezoelectric device of FIG. 3B.
Figure 5A:
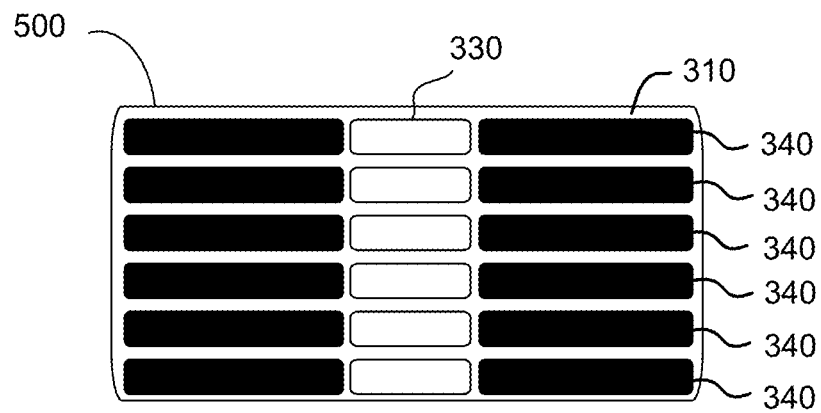
FIG. 5A is a sectional view of piezoelectric cable in accordance with one embodiment of the present disclosure.
Figure 5B:
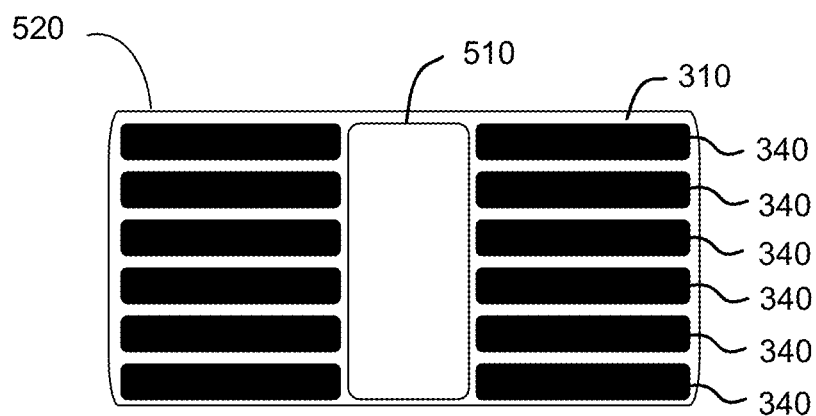
FIG. 5B is a sectional view of piezoelectric cable in accordance with another embodiment of the present disclosure.

Referring now to FIGS. 4 to 5B, a piezoelectric cable or wire in accordance with one embodiment of the present disclosure will be described. The piezoelectric cable comprises a number of ionic rings from the piezoelectric device from FIG. 3A or 3B which are arranged in a stacked formation. FIG. 4 shows a sectional view of a piezoelectric device 320 of FIG. 3B taken along line IV-IV which shows the central conductor 330 and the ionic ring 340 provided by the piezoelectric elements 100 which surround the central conductor 330.

FIG. 5A shows a number of ionic rings 340 arranged in a stacked formation and embedded within a dielectric substrate 310 to form a piezoelectric cable 500 in accordance with one embodiment of the present disclosure. The dielectric substrate 310 provides the sheath for the piezoelectric cable 500. In the shown embodiment, the ionic rings 340 are connected in series with a separate conductor 330 at the center of each ionic ring 340. The conductor 330 of the different ionic rings 340 are connected via a suitable electrical connector, such as a wire or interconnect. The ionic rings 340 are connected so that the first electrodes 210 (positive electrodes) are connected in series and the second electrodes 220 (negative electrodes) are connected in series. The first conductor 330A acts as a positive electrical connector and the second conductor 330B acts as a negative electrical connector. While the ionic rings 340 in FIG. 5A may appear immediately adjacent to each other, the piezoelectric disc devices are typically spaced apart from each other to provide tolerance for the various connectors and interconnects between the piezoelectric devices 200 and the conductors 330A, 330B.

FIG. 5B shows a number of ionic rings 340 arranged in a stacked formation and embedded within a dielectric substrate 310 to form a piezoelectric cable 520 in accordance with one embodiment of the present disclosure. The piezoelectric cable 520 is similar to the piezoelectric cable 500 with the notable difference that a single central conductor 530 is used to connect to the ionic rings 340 rather than a number of separate conductors 330. Similar to the embodiments described above, the central conductor 530 as has a first conductor (not shown) which acts as a positive electrical connector and a second conductor (not shown) which acts as a negative electrical connector.

In other embodiments, rather than dielectric substrate 310 providing the sheath for the piezoelectric cable, a separate sheath may be provided for the piezoelectric cable to protection the cable from damage. In such alternative embodiments, piezoelectric disc devices 320 from FIG. 3B may be stacked and connected similar to the ionic rings 340 in the above-described embodiments, and the sheath may be applied to the exterior of the stacked piezoelectric disc devices 320.

While the piezoelectric cables in FIGS. 5A and 5B are illustrated with six ionic rings 340, it is contemplated that many more ionic rings 340 will be provided in commercial embodiments to increase the amount of energy captured. It is contemplated that any number of ionic rings 340 may be used and connected in series to form a piezoelectric cable. It is also contemplated that at least some ionic rings 340 may be connected in parallel, to provide more than one source of power to the host device (e.g., one source could power a sensor or device while another source could be used to power another sensor or device or charge the battery). It is also contemplated that the length and/or number of ionic rings 340 in the piezoelectric cable can be adjusted for specific applications or power generation requirements.

Figure 6A:
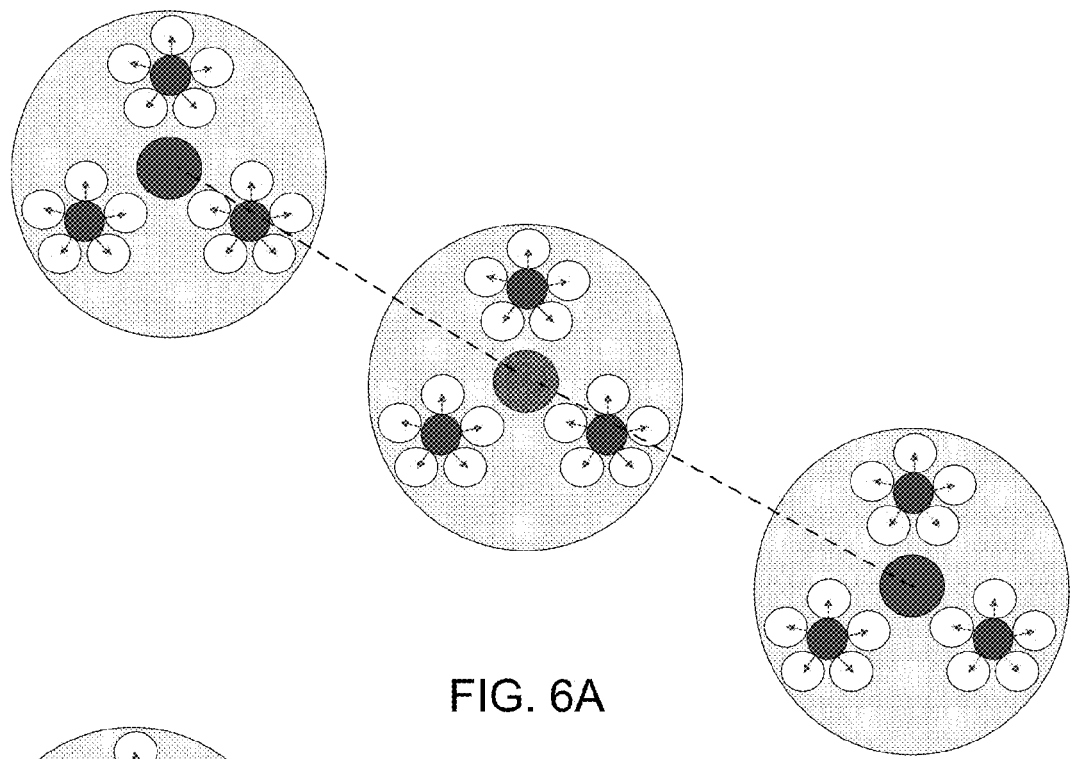
FIGS. 6A-6C are exploded views of piezoelectric cable in accordance with various embodiment of the present disclosure.

FIG. 6A is an exploded view of a piezoelectric cable in accordance with one embodiment of the present disclosure showing three adjacent ionic rings 340. The piezoelectric elements 100 are shown in ionic form similar as in FIGS. 1A and 1B. In this embodiment, each ionic ring 340 in the piezoelectric cable is substantially the same in that each ionic ring 340 has the same type, number and arrangement of piezoelectric elements 100. The ionic ring 340 are aligned so that the piezoelectric elements 100 of adjacent ionic rings are opposite (e.g., beside) each other when stacked.

Figure 6B:
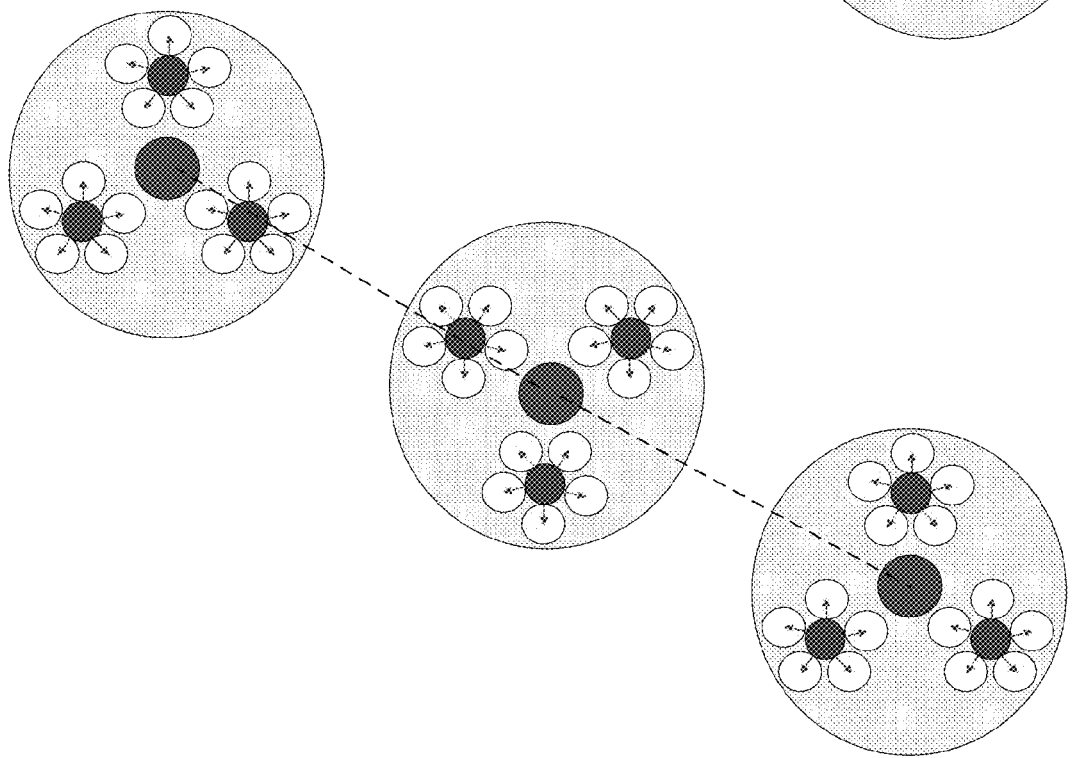

FIG. 6B is an exploded view of a piezoelectric cable in accordance with another embodiment of the present disclosure showing three adjacent ionic rings 340. The piezoelectric elements 100 are shown in ionic form similar as in FIGS. 1A and 1B. The piezoelectric cable is generally similar to that shown in FIG. 6A with the notable difference that the ionic rings 340 are offset, rotated, staggered or otherwise positioned such that the piezoelectric elements 100 in adjacent ionic rings are not aligned. It is contemplated that the staggered arrangement of the piezoelectric elements 100 may improve the electrical response to deformation of the piezoelectric cable irrespective of the direction or magnitude of the deformation.

Figure 6C:
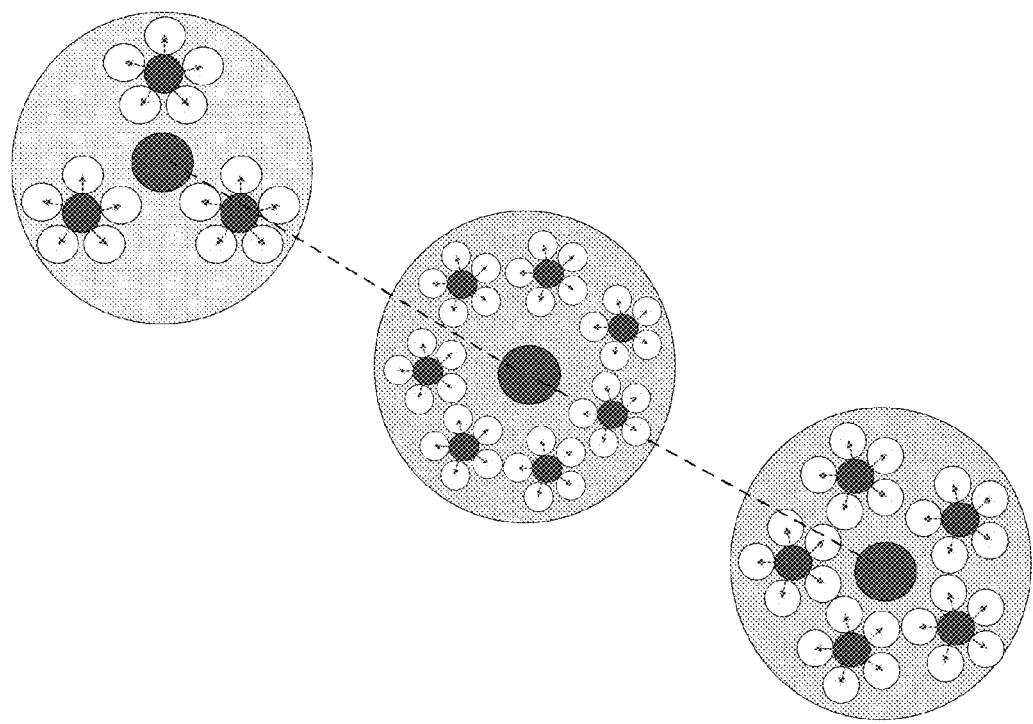

FIG. 6C is an exploded view of a piezoelectric cable in accordance with a further embodiment of the present disclosure showing three adjacent ionic rings 340. The piezoelectric elements 100 are shown in ionic form similar as in FIGS. 1A and 1B. In this embodiment, the piezoelectric elements 100 in adjacent ionic rings differ in type, number and/or arrangement of piezoelectric elements 100. For example, in the shown embodiment the ionic rings 340 may have 3, 5 or 7 piezoelectric elements. It is contemplated that pseudorandom or otherwise differing adjacent ionic rings may improve the electrical response to deformation of the piezoelectric cable irrespective of the direction or magnitude of the deformation.

While the ionic rings and piezoelectric cables in the above-described embodiments are illustrated as having round cross-sections, other shapes and arrangements can be used.

Figure 7:
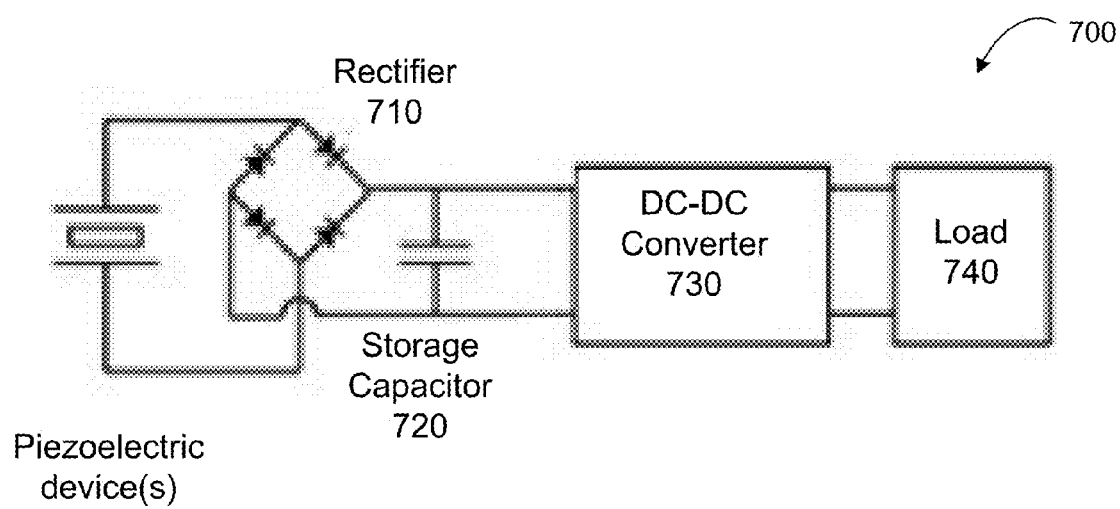
FIG. 7 is a circuit diagram of a piezoelectric generator in accordance with an example embodiment of the present disclosure.

Referring now to FIG. 7, an energy harvester circuit diagram for a piezoelectric generator 700 in accordance with an example embodiment of the present disclosure will be described. The piezoelectric generator 700 extracts energy from a piezoelectric element 100 in response to mechanical deformation caused by applied forces. The piezoelectric generator 700 comprises one or more piezoelectric devices, such as the piezoelectric device 200, 300 or 320 or a piezoelectric cable 500 or 520. It is contemplated that the number and/or size of the piezoelectric devices can be adjusted for specific applications or power generation requirements.

The piezoelectric generator 700 also comprises a rectifier 710 because piezoelectric device can produce a current in either direction depending on the direction of the applied force and subsequent mechanical deformation. The rectifier 710 permits electrical energy to be extracted regardless of the direction of the current. A suitable rectifier 710 can be selected based on the electrical energy generated by the piezoelectric device and the load for which the direct current (DC) current is being supplied, among several factors. The rectifier 710 could be, for example, a half-wave or full-wave rectifier depending on the embodiment. The rectifier 710 outputs a DC current which passes to a storage capacitor 720.

The storage capacitor 720 is typically a supercapacitor, also known as ultracapacitor or double-layer capacitor, which differs from a regular capacitor in that it has a very high capacitance. The supercapacitor seeks to at least temporality replace the function of battery of the host device in which the piezoelectric generator 700 is incorporated or to at least temporality supplement the battery. A capacitor stores energy by means of a static charge as opposed to an electrochemical reaction. The supercapacitor is charged the DC current applying a voltage differential on positive and negative plates of the supercapacitor. An advantage of supercapacitor is that it has more charge and discharge cycles than a battery can supply. Other advantages of a supercapacitor are high power density, high cycle efficiency, longer lifetime, and lower toxicity of material used as compared to a battery.

A comparator (not shown) may be used to determine when a start-up threshold level of energy has been stored by the storage capacitor 720. When the start-up threshold level of energy has been stored, the storage capacitor 720 may be used to at least temporality replace the function of battery of the host device or to at least temporality supplement the battery until the energy stored in the storage capacitor 720 has been depleted to a shutdown threshold level of energy.

The start-up threshold should be set to prevent, minimize or at least reduce "cold booting" which can occur when a system starts running from zero stored energy. If the system starts booting up as soon as it has harvested enough energy, it is likely to drain the energy shortly after booting, forcing the system to reset and repeat the cycle of futile attempts to boot up. The use of a start-up threshold level of energy allows booting of the piezoelectric generator 700 to be delayed until sufficient energy has been harvested. The start-up threshold level should be balanced against the desire to minimize latency.

The output of the storage capacitor 720 is sent to a DC-DC converter 730. The DC-DC converter 730 is a class of power converter which is used to converts DC current from the storage capacitor 720 which is at one voltage level to the voltage level of a load 740. While not shown, a voltage regulator may be used to reduce the variation on the voltage sent to the load 740.

The load 740 depends on the host device in which the piezoelectric generator 700 is incorporated. When the host device is a portable electronic device, the load 740 may be one or more device components such as a sensor, input device, output device, battery interface, or charging circuitry coupled to a battery interface. In such embodiments, the piezoelectric device is embedded in a housing (external or internal) of a portable electronic device, such as the external case of the portable electronic device. The control circuitry of the piezoelectric generator 700 may be inside the portable electronic device where it is protected from damage from user interaction or other like. The piezoelectric device, or a combination of piezoelectric devices, may be arranged so that the piezoelectric elements 100 form a rectilinear array or lattice formation throughout the case of the portable electronic device or other embedded substrate. This array or lattice formation provides a relative uniform distribution of the piezoelectric elements 100 which a large coverage area.

When the piezoelectric generator 700 includes more than one piezoelectric device, the piezoelectric devices are connected in series to sum the current from the piezoelectric devices. However, at least some of the piezoelectric devices may be connected in parallel, to provide more than one source of power to the host device (e.g., one source could power a sensor or device while another source could be used to power another sensor or device or charge the battery) with the necessary adaptation of the energy harvester circuit. The piezoelectric generator 700 may be configured to power one or more device components either at the same time (e.g., when some of the piezoelectric devices are connected in parallel) or alternatively, depending on the capabilities of the piezoelectric generator 700 and the control circuitry of the piezoelectric generator 700 among several factors.

When the piezoelectric device(s) of the piezoelectric generator 700 are embedded in the case the portable electronic device, the piezoelectric device(s) can generate electrical energy from applied forces such as mechanical stress, strain or vibrations of the device as it is carried in a bag, a pocket, or a person's hand.

Electrical energy can also be generated by a user interaction with the portable electronic device, such as typing or taping keys or a touchscreen, squeezing the portable electronic device, or vibrations caused by a buzzer or speaker. To facilitate the harvesting of energy from such sources, the piezoelectric device(s) can be positioned proximate to the touchscreen, keyboard, buttons, speaker or buzzer to better capture the mechanical energy associated with interaction with these device components. Different piezoelectric device(s) may be positioned in different areas of the housing of the portable electronic device to capture mechanical energy from different areas or components of the portable electronic device.

The piezoelectric generator 700 can be incorporated into objects other than a portable electronic device to generate electrical energy from the movement or mechanical forces applied to those objects. In on example, one or more piezoelectric cables can be embedded in the sole of a shoe or the like to capture mechanical energy from the user walking, and the load 740 may be a sensor, control interface, input device or output device incorporated in the shoe of the like.

In another example, one or more piezoelectric cables can be woven into a fabric used to make articles such as clothing, bags, watches, shoe tops, water bottles or the like, to capture mechanical energy caused when a person wearing or carrying the articles is moving, and the load 740 may be a sensor, control interface, input device or output device incorporated in the article.

In a further example, one or more piezoelectric cables can be woven or otherwise incorporated in a tent, umbrella or other camping gear to capture mechanical energy caused by wind or motion or other sources, and the load 740 may be integrated lighting in the tent or umbrella, or a sensor, control interface, input device or output device incorporated in the other camping gear.

In yet a further example, one or more piezoelectric cables may be embedded in a data and/or power cord or cable. The cord or cable can be an audio cable for a set of headphones, a power cord for an electronic device such as an electric lawnmower, vacuum cleaner or light string (e.g., Christmas lights), a data cable such as a USB (Universal Serial Bus) cable, an HDMI (High-Definition Multimedia Interface) cable, telephone cord, or any other suitable cable. The mechanical energy caused by movement or mechanical strain on these cords or cables can be captured and stored to provide supplemental power to a load of the cord or cable (light string) or the load may be, or be part, the device to which the cord or cable is connected.

The amount of piezoelectric electricity by the piezoelectric generator 700 depends on the number of piezoelectric elements, the type of piezoelectric material, the amount and type of mechanic deformation, frequency of excitation, and load resistance among of the factors.

Figure 8:
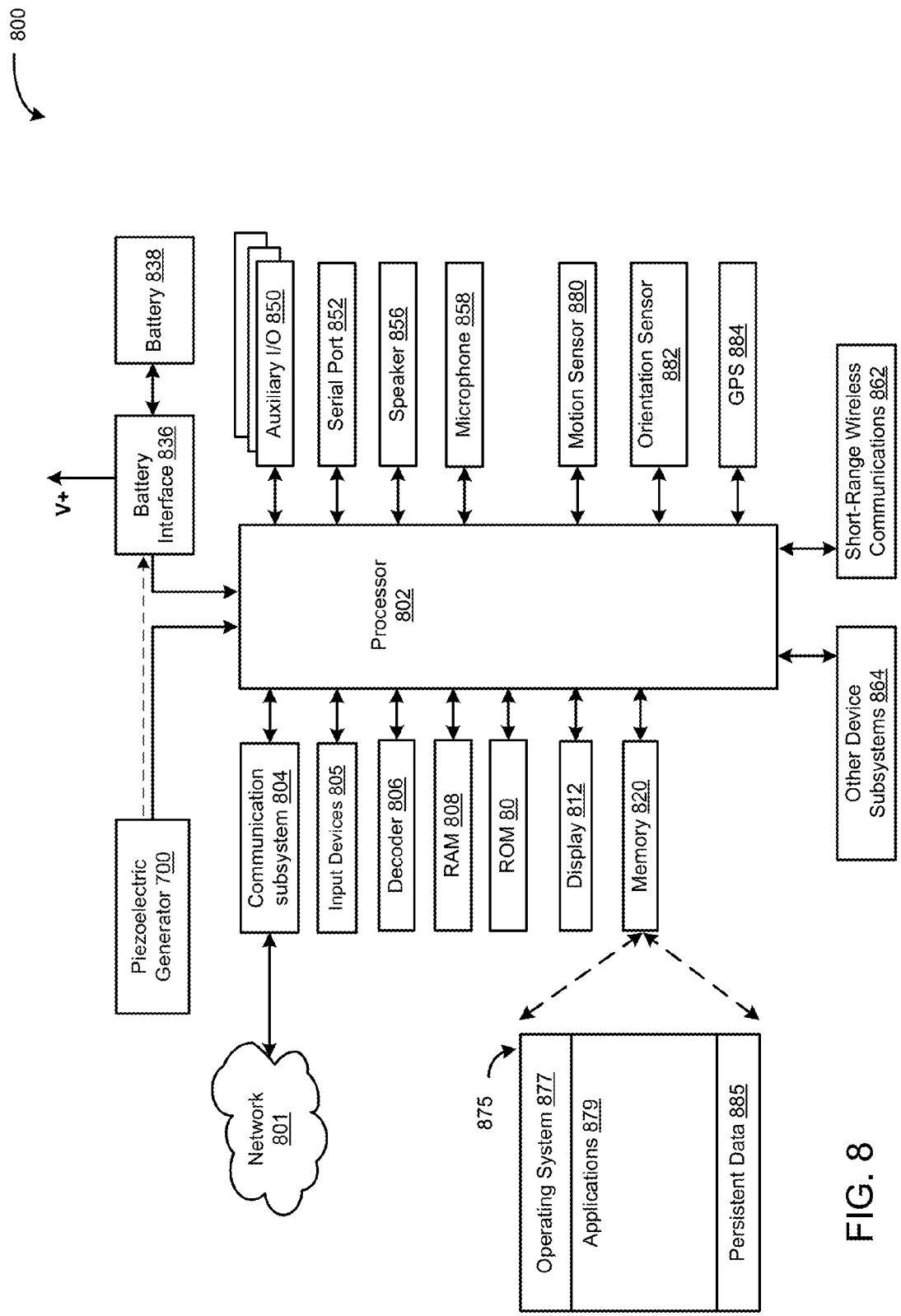
FIG. 8 is a simplified block diagram of components of an electronic device suitable for carrying out example embodiments of the present disclosure.

Reference is next made to FIG. 8 which illustrates a portable electronic device 800 (referred to hereinafter as merely electronic device 800 for convenience) in which example embodiments described in the present disclosure can be applied. The electronic device 800 described below has wireless communication capabilities; however, it is contemplated that the teachings of the present disclosure may be applied to devices without wireless communication capabilities. Examples of the electronic device 800 include, but are not limited to, a mobile phone, smartphone or superphone, tablet computer, notebook computer (also known as a laptop, netbook or ultrabook computer depending on the device capabilities), wireless organizer, personal digital assistant (PDA), electronic gaming device, special purpose digital camera (which may be capable of both still image and video image capture), navigation device (such as a global positioning system navigator), remote control and digital audio/video players. Such devices may be handheld, that is, sized or shaped to be held and carried in a human hand and used while held or carried.

The electronic device 800 includes a case (not shown) housing the electronic components of the electronic device 800. The electronic components of the electronic device 800 are mounted on a printed circuit board (not shown). The electronic device 800 includes at least one processor 802 such as a microprocessor which controls the overall operation of the electronic device 800. Communication functions, including data and voice communications, are performed through a communication subsystem 804. Data received by the electronic device 800 may be decompressed and decrypted by a decoder 806. The communication subsystem 804 receives messages from and sends messages to a wireless network 801. The wireless network 801 may be any suitable type of wireless network.

The processor 802 interacts with other components, such as one or more input devices 805, Random Access Memory (RAM) 808, Read Only Memory (ROM) 810, a display 812 such as a colour liquid crystal display (LCD), persistent (non-volatile) memory 820 which may be flash erasable programmable read only memory (EPROM) memory ("flash memory") or any other suitable form of memory, a piezoelectric generator 700, a motion sensor 880 which enables to processor 802 to determine whether the electronic device 800 is in motion and the nature of any sensed motion at any appropriate time, e.g., when an image is captured, an orientation sensor 882 which enables the processor 802 to determine which direction the electronic device 800 is pointed at any appropriate time, e.g., when an image is captured, e.g., when an image is captured, global positioning system (GPS) device 884 which enables the processor 802 to determine GPS coordinates (i.e., location) of the electronic device 800 at any appropriate time, e.g., when an image is captured, auxiliary input/output (I/O) subsystems 850, data port 852 such as serial data port (e.g., USB data port), speaker 856, microphone 858, short-range communication subsystem 862, and other device subsystems generally designated as 864. The components of the electronic device 800 are coupled via a communications bus (not shown) which provides a communication path between the various components.

The display 812 typically includes a display area in which information may be displayed and a non-display area extending around the periphery of the display area. Information is not displayed in the non-display area. The non-display area may be utilized to accommodate, for example, electronic traces or electrical connections, adhesives or other sealants, and/or protective coatings around the edges of the display area.

The display 812 may be provided as part of a touch-sensitive display which provides an input device 805. The display 812 which together with a touch-sensitive overlay (not shown) operably coupled to an electronic controller (not shown) comprise the touch-sensitive display.

User-interaction with the GUI is performed through the input devices 805. Information, such as text, characters, symbols, images, icons, and other items are rendered and displayed on the display 812 via the processor 802. The processor 802 may interact with the orientation sensor to detect direction of gravitational forces or gravity-induced reaction forces so as to determine, for example, the orientation of the electronic device 800 in order to determine a screen orientation for the GUI.

When the display 812 is provided as part of a touch-sensitive display, the capture button, zoom button and other camera controls may be provided by onscreen user interface elements displayed on the display 812 instead of, or in addition to, physical interface components. The keyboard may be provided instead of, or in addition to, a touch-sensitive display depending on the embodiment. At least some of the control buttons may be multi-purpose buttons rather than special purpose or dedicated buttons.

The processor 802 operates under stored program control and executes software modules 875 stored in memory, for example, in the persistent memory 820. As illustrated in FIG. 8, the software modules 875 comprise operating system software 877 and software applications 879. Persistent data 885, such as user data, can also be stored in the persistent memory 820.

The software modules 875 or parts thereof may be temporarily loaded into volatile memory such as the RAM 808. The RAM 808 is used for storing runtime data variables and other types of data or information. Although specific functions are described for various types of memory, this is merely one example, and a different assignment of functions to types of memory could also be used.

The electronic device 800 also includes a battery 838 as a power source, which is typically one or more rechargeable batteries that may be charged, for example, through charging circuitry coupled to a battery interface such as the serial data port 852. The battery 838 provides electrical power to at least some of the electrical circuitry in the electronic device 800, and the battery interface 836 provides a mechanical and electrical connection for the battery 838. The battery interface 836 is coupled to a regulator (not shown) which provides power V+ to the circuitry of the electronic device 800.

The piezoelectric generator 700 is contained at least partially within the case of the electronic device 800. While control circuitry of the piezoelectric generator 700 may be contained with the case, the piezoelectric elements 100 of the piezoelectric generator 700 are located in at least a portion of the case for user interaction, i.e. for receiving an applied force which causes mechanical deformation of the piezoelectric elements 100 of the piezoelectric generator 700. The piezoelectric generator 700 converts applied forces into electrical energy which is used to at least partially power the electronic device 100.

The piezoelectric generator 700 is connected to one or more device components such as a sensor (e.g., motion sensor 880 or an orientation sensor 882), input device (e.g., GPS device 884), output device (e.g., touchscreen display), or the battery interface 836. The piezoelectric generator 700 may be configured to power one or more of these device components either at the same time or alternatively, depending on the capabilities of the piezoelectric generator 700 and the control circuitry of the piezoelectric generator 700 among several factors.

The piezoelectric generator 700 may be connected to the battery interface 836 and configured, via appropriate charging circuitry, for charging the battery 838 in response to mechanical deformation of the piezoelectric element(s) of the piezoelectric generator 700 rather than directly powering the electronic device 100.

A received signal, such as a text message, an e-mail message, or web page download, is processed by the communication subsystem 104 and input to the processor 102. The processor 102 processes the received signal for output to the display 82 and/or to the auxiliary I/O subsystem 150. A subscriber may generate data items, for example e-mail messages, which may be transmitted over the wireless network 101 through the communication subsystem 104, for example.

The present disclosure may be embodied in other specific forms without departing from the subject matter of the claims. The described example embodiments are to be considered in all respects as being only illustrative and not restrictive. The present disclosure intends to cover and embrace all suitable changes in technology. The scope of the present disclosure is, therefore, described by the appended claims rather than by the foregoing description. The scope of the claims should not be limited by the preferred embodiments set forth in the examples, but should be given the broadest interpretation consistent with the description as a whole.

The invention claimed is:

1. A piezoelectric device, comprising:
 a piezoelectric polycrystal having a centre including a plurality of ionic components of a first polarity and an annular ring including a plurality of ionic components of a second polarity opposite to the first polarity arranged annularly around the centre including ionic components of the first polarity, the piezoelectric polycrystal having a number of dipoles each formed between the ionic components of the first polarity and ionic components of the second polarity, wherein the dipoles are each oriented in a different direction, wherein the piezoelectric polycrystal has a dipole moment representing the separation of positive and negative electrical charges in the piezoelectric polycrystal, wherein the dipoles are arranged such that, in an unactuated state of the piezoelectric polycrystal, a zero dipole moment is formed by the dipoles of the piezoelectric polycrystal and, in an actuated state of the piezoelectric polycrystal caused by a force, a net dipole moment is formed by the dipoles of the piezoelectric polycrystal; and a pair of electrodes located about the polycrystal to conduct a current created by the net dipole moment formed by the dipoles of the piezoelectric polycrystal.

2. The piezoelectric device of claim 1, wherein the pair of electrodes is located about the piezoelectric polycrystal to conduct the current created by the net dipole moment formed by the dipoles of the piezoelectric polycrystal when the piezoelectric polycrystal is in an actuated state.

3. The piezoelectric device of claim 1, wherein the dipoles in the piezoelectric polycrystal are asymmetrically arranged in the unactuated state such that the dipoles lack a center of symmetry.

4. The piezoelectric device of claim 1, wherein the piezoelectric polycrystal comprises an odd number of dipoles.

5. The piezoelectric device of claim 1, wherein the piezoelectric polycrystal has 3 or more dipoles.

6. The piezoelectric device of claim 1, wherein the piezoelectric polycrystal has 3, 5 or 7 dipoles.

7. The piezoelectric device of claim 1, wherein the piezoelectric polycrystal has 5 dipoles.

8. The piezoelectric device of claim 1, wherein the piezoelectric device comprises a number of piezoelectric polycrystals arranged in layers received within a dielectric substrate, wherein each layer comprises a number of piezoelectric polycrystals arranged in an annular formation around a central conductor which provides the pair of electrodes.

9. The piezoelectric device of claim 1, wherein the ionic components of the second polarity are equally spaced apart from each other.

10. The piezoelectric device of claim 8, wherein the layers are arranged in a stacked formation to form a piezoelectric cable.

11. The piezoelectric device of claim 10, wherein adjacent layers differ in type, number and/or arrangement of the ionic components.

12. The piezoelectric device of claim 10, wherein the layers are arranged such that the ionic components of adjacent layers are not aligned.

13. The piezoelectric device of claim 8, wherein the dielectric substrate elastically deforms in response to applied forces.

14. The piezoelectric device of claim 8, wherein each of the layers is individually connected to the electrodes.

15. A piezoelectric generator, comprising:
a piezoelectric device, comprising:
a piezoelectric polycrystal having a centre including a plurality of ionic components of a first polarity and an annular ring including a plurality of ionic components of a second polarity opposite to the first polarity arranged annularly around the centre including ionic components of the first polarity, the piezoelectric polycrystal having a number of dipoles each formed between the ionic components of the first polarity and ionic components of the second polarity, wherein the dipoles are each oriented in a different direction, wherein the piezoelectric polycrystal has a dipole moment representing the separation of positive and negative electrical charges in the piezoelectric polycrystal, wherein the dipoles are arranged such that, in an unactuated state of the piezoelectric polycrystal, a zero dipole moment is formed by the dipoles of the piezoelectric polycrystal and, in an actuated state of the piezoelectric polycrystal caused by a force, a net dipole moment is formed by the dipoles of the piezoelectric polycrystal; and a pair of electrodes located about the polycrystal to conduct a current created by the net dipole moment formed by the dipoles of the piezoelectric polycrystal; and an energy harvesting circuit connected to the piezoelectric device to capture and store electrical energy provided by the current.

16. The piezoelectric generator of claim 15, wherein the piezoelectric device is embedded in a housing of a portable electronic device.

17. The piezoelectric generator of claim 16, wherein the piezoelectric polycrystals are arranged in an array or lattice formation throughout the case.

18. The piezoelectric generator of claim 17, wherein the piezoelectric device is embedded at or proximate to a key, a touchscreen, a buzzer or a speaker of the portable electronic device.

19. The piezoelectric generator of claim 16, wherein the piezoelectric device is a piezoelectric cable comprised of a plurality of layers arranged in a stacked formation and received within a dielectric substrate, wherein each layer comprises a number of piezoelectric polycrystals arranged in an annular formation around a central conductor which provides the pair of electrodes.

20. The piezoelectric generator of claim 19, wherein the piezoelectric cable is embedded in an article which can be carried or worn.

21. The piezoelectric generator of claim 19, wherein the piezoelectric cable is embedded in a data and/or power cable or cord.

22. A piezoelectric element, comprising:
a plurality of piezoelectric polycrystals received within a dielectric substrate, each piezoelectric polycrystal having a centre including a plurality of ionic components of a first polarity and an annular ring including a plurality of ionic components of a second polarity opposite to the first polarity arranged annularly around the centre including ionic components of the first polarity, each piezoelectric polycrystal having a number of dipoles each formed between the ionic components of the first polarity and ionic components of the second polarity, wherein the dipoles are each oriented in a different direction, wherein the piezoelectric polycrystals are arranged in a number of layers, wherein each layer comprises a number of piezoelectric polycrystals arranged in an annular formation around a central conductor, wherein the piezoelectric polycrystal has a dipole moment representing the separation of positive and negative electrical charges in the piezoelectric polycrystal, wherein the dipoles are arranged such that, in an unactuated state of the piezoelectric polycrystal, a zero dipole moment is formed by the dipoles of the piezoelectric polycrystal and, in an actuated state of the piezoelectric polycrystal caused by a force, a net dipole moment is formed by the dipoles of the piezoelectric polycrystal.

23. The piezoelectric device of claim 1, wherein the piezoelectric polycrystal is formed from a piezoelectric crystal or a piezoelectric ceramic.

24. The piezoelectric device of claim 8, wherein the piezoelectric polycrystals in each layer are equally spaced apart from each other.

25. The piezoelectric polycrystal of claim 1, wherein the piezoelectric polycrystal is formed of one or more of quartz ($SiO_2$), berlinite ($AlPO_4$), gallium orthophosphate ($GaPO_4$), tourmaline, topaz, Rochelle salt or cane sugar.

26. The piezoelectric generator of claim 15, wherein the piezoelectric polycrystal is formed of one or more of quartz ($SiO_2$), berlinite ($AlPO_4$), gallium orthophosphate ($GaPO_4$), tourmaline, topaz, Rochelle salt or cane sugar.

27. The piezoelectric element of claim 22, wherein the piezoelectric polycrystal is formed of one or more of quartz ($SiO_2$), berlinite ($AlPO_4$), gallium orthophosphate ($GaPO_4$), tourmaline, topaz, Rochelle salt or cane sugar.

* * * * *